(12) United States Patent
Kamiyama (10) Patent No.: US 6,607,979 B1
(45) Date of Patent: Aug. 19, 2003

(54) SEMICONDUCTOR DEVICE AND METHOD OF PRODUCING THE SAME

(75) Inventor: Satoshi Kamiyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/670,400

(22) Filed: Sep. 27, 2000

(30) Foreign Application Priority Data

Sep. 30, 1999 (JP) .......................................... 11-280126

(51) Int. Cl.⁷ ..................... H01L 21/44; H01L 21/336; H01L 21/3205
(52) U.S. Cl. ..................... 438/653; 438/301; 438/588; 438/652; 438/654; 438/660; 438/663
(58) Field of Search ................................. 438/299, 301, 438/305, 306, 585, 588, 592, 595, 652, 653, 654, 660, 663

(56) References Cited

U.S. PATENT DOCUMENTS

| | | | | |
|---|---|---|---|---|
| 5,652,181 A | * | 7/1997 | Thakur ........................ | 438/385 |
| 5,719,410 A | * | 2/1998 | Suehiro et al. ................ | 257/77 |
| 5,861,340 A | * | 1/1999 | Bai et al. ..................... | 438/592 |
| 5,877,074 A | * | 3/1999 | Jeng et al. .................... | 438/592 |
| 5,888,588 A | * | 3/1999 | Nagabushnam et al. .. | 427/248.1 |
| 5,907,188 A | * | 5/1999 | Nakajima et al. ............. | 257/751 |
| 5,923,999 A | * | 7/1999 | Balasubramanyam et al. ......................... | 438/592 |
| 5,960,303 A | * | 9/1999 | Hill ............................ | 438/592 |
| 6,004,869 A | * | 12/1999 | Hu .............................. | 438/585 |
| 6,087,700 A | * | 7/2000 | Fazan et al. .................. | 257/413 |
| 6,103,609 A | * | 8/2000 | Lee et al. ..................... | 438/592 |
| 6,146,742 A | * | 11/2000 | Hsieh et al. .................. | 428/209 |
| 6,187,656 B1 | * | 2/2001 | Lu et al. ...................... | 438/592 |
| 6,198,144 B1 | * | 3/2001 | Pan et al. ..................... | 257/412 |
| 6,207,568 B1 | * | 3/2001 | Liu et al. ..................... | 438/688 |
| 6,218,296 B1 | * | 4/2001 | Kwak et al. .................. | 438/653 |
| 6,303,483 B1 | * | 10/2001 | Kunikiyo ..................... | 438/592 |
| 6,306,761 B1 | * | 10/2001 | Taguchi ....................... | 438/646 |

FOREIGN PATENT DOCUMENTS

| | | |
|---|---|---|
| JP | 61-224435 | 10/1986 |
| JP | 10-12869 | 1/1998 |
| JP | 10-289885 | 10/1998 |
| JP | 11-26757 | 1/1999 |
| JP | 11-238736 | 8/1999 |

* cited by examiner

Primary Examiner—Caridad Everhart
Assistant Examiner—Chuong A Luu
(74) Attorney, Agent, or Firm—Sughrue Mion, PLLC (57) ABSTRACT

A semiconductor device of the present invention includes a conductive film made up of a polysilicon film, a barrier metal film and a high melting point, metal nitride film sequentially laminated in this order. The conductive film is annealed to lower the resistance of the metal nitride film. Annealing causes the metal nitride film, which is formed in an amorphous state, to release nitrogen and increases the crystal size of metal having a high melting point. This successfully improves the crystallization of the high melting point metal and lowers the resistance of the metal nitride film without regard to the crystallization of the underlying barrier metal film. It is therefore possible to improve the crystallization of the metal nitride film or to obviate the step of providing the barrier metal film with a double-layer structure, i.e., to simplify the production procedure. A method of producing the semiconductor device is also disclosed.

27 Claims, 7 Drawing Sheets

SEMICONDUCTOR DEVICE AND METHOD OF PRODUCING THE SAME

BACKGROUND OF THE INVENTION

The present invention relates to a semiconductor device including a conductive film implementing, e.g., a gate electrode included in a MOS (Metal Oxide Semiconductor) transistor or an interconnection or wiring, and a method of producing the same. More particularly, the present invention relates to a semiconductor device capable of lowering the resistance of a conductive film thereof and a method of producing the same.

In parallel with the trend toward high speed, highly integrated semiconductor devices, there is an increasing demand for a decrease in the size of electrodes included in semiconductor devices and the size of interconnections between the devices. However, a decrease in the size, particularly a width, of electrodes and that of interconnections bring about a problem that the resistance of electrodes and that of interconnections noticeably aggravate signal delay, voltage fall and other circuit factors. Particularly, a polysilicon layer conventionally used as an electrode or an interconnection and lowered in resistance by a dopant aggravates signal delay because polysilicon has relatively high resistivity. To solve this problem, there has been proposed to form a titanium, cobalt, tungsten or similar metal film having a high melting point on a polysilicon film. Metal having a high melting point and silicon react to form a metal silicide layer having a high melting point and thereby form a polycrystal line silicide structure. Even the polycrystal line silicide structure, however, cannot lower the resistivity of the metal silicide having a high melting point beyond a certain limit. Specifically, when an interconnection or wiring is 0.2 μm thick or less and is reduced in width from conventional 0.18 μm to 0.13 μm, resistance lower than 4 $\Omega.cm^2$ is required as the sheet resistance of the interconnection. Such a low resistance is, however, difficult to achieve with the polycrystalline silicide structure.

A metal/polysilicon structure in which a film of metal having a high melting point is formed on a polysilicon film is one of recent achievements in the semiconductors device art. The metal/polysilicon structure is expected to implement low resistance because a high melting point, metal silicide layer is absent. Specifically, after a film of tungsten or similar metal having a high melting point has been formed on a polysilicon film, a semiconductor device with, e.g., the tungsten film is annealed. For example, after a tungsten/polysilicon (W/Si) structure has been formed as the gate electrode of a MOS transistor, ions are implanted in a source and a drain region. This is followed by annealing for activation. Annealing, however, causes polysilicon and tungsten to react with each other and form tungsten silicide (WSi).

In light of the above, a barrier metal film implemented by a titanium nitride (TiN) film or similar metal nitride film may be formed between the polysilicon film and the tungsten film in order to suppress the reaction of polysilicon and tungsten, as also proposed in the past. However, it is difficult to lower the resistivity of the metal structure, i.e., W/TiN structure even with the barrier metal film. In this connection, we found by measurement that the resistivity of the tungsten film forming part of the W/TiN structure was about seven to eight times as high as the resistivity of bulk tungsten. This is presumably because the crystal structure of the barrier metal film affects the crystallization of the overlying tungsten film and thereby suppresses the crystal growth of the tungsten film, limiting the decrease in the resistivity of the W/TiN structure.

To implement low resistivity, Japanese Patent Laid-Open Publication No. 10-12869 (prior art 1 hereinafter) discloses a conductive film that is a laminate of a tungsten film, a TiN film, and a polysilicon film. In this structure, the TiN film, which serves as a barrier metal film, is caused to recrystallize so as to increase the grain size. This improves the crystallization of the tungsten film and thereby lowers resistance. Japanese Patent Laid-Open Publication No. 10-289885 (prior art 2 hereinafter) teaches a conductive film in the form of a high melting point metal/TiN/polysilicon laminate structure. This conductive film is characterized in that the barrier metal film is provided with a double-layer structure in order to improve the crystallization of the overlying, high melting point metal film for thereby lowering resistance.

However, the prior art 1 needs an additional step for the recrystallization of the barrier metal film while the prior art 2 needs an additional step for providing the barrier metal film with a double-layer structure. Such an additional step makes a production line sophisticated when combined with the essential steps of sequentially forming the consecutive layers of the conductive film. Moreover, the recrystallization and double-layer structure both increase the film thickness of the barrier metal and therefore the overall thickness of the conductive film. This obstructs the implementation of thin electrodes and thin interconnections that is necessary for scaling down semiconductor devices.

SUMMARY OF THE INVENTION

It is therefore an object of the present invention to provide a semiconductor device capable of reducing the resistivity of its top metal film without resorting to a sophisticated production line or increasing the thickness of a barrier metal film.

In accordance with the present invention, in a semiconductor device, a conductive film formed on a semiconductor substrate for forming an electrode, an interconnection or the like is implemented as a laminate of a polysilicon film, a barrier metal film and a metal nitride film having a high melting point, as named from the bottom to the top of the laminate.

Also, in accordance with the present invention, a method of producing a conductive film included in a semiconductor device includes the steps of sequentially forming a laminate made up of a polysilicon film, a barrier metal film and a metal nitride film having a high melting point on an insulation film in this order, and annealing the laminate to thereby lower the resistance of the metal nitride film.

Further, in accordance with the present invention, a method of producing a gate electrode included in a MOS transistor includes the steps of sequentially forming a polysilicon film, a barrier metal film and a metal nitride layer having a high melting point on a gate insulation film in this order to thereby constitute a conductive film having a laminate structure, patterning the conductive film to thereby form the gate electrode, implanting ions in a source and a drain region in a semiconductor layer by using the gate electrode as a mask, and effecting annealing to thereby activate the resulting ion implanted layers and lower the resistance of the metal nitride film at the same time.

Moreover, in accordance with the present invention, a method of producing a gate electrode included in a MOS transistor includes the steps of sequentially forming a polysilicon film, a barrier metal film and a metal nitride film having a high melting point on a gate insulation film in this order to thereby constitute a conductive film having a laminate structure, annealing the conductive film to thereby lower the resistance of the metal nitride layer, and patterning the conductive film to thereby form the gate electrode.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
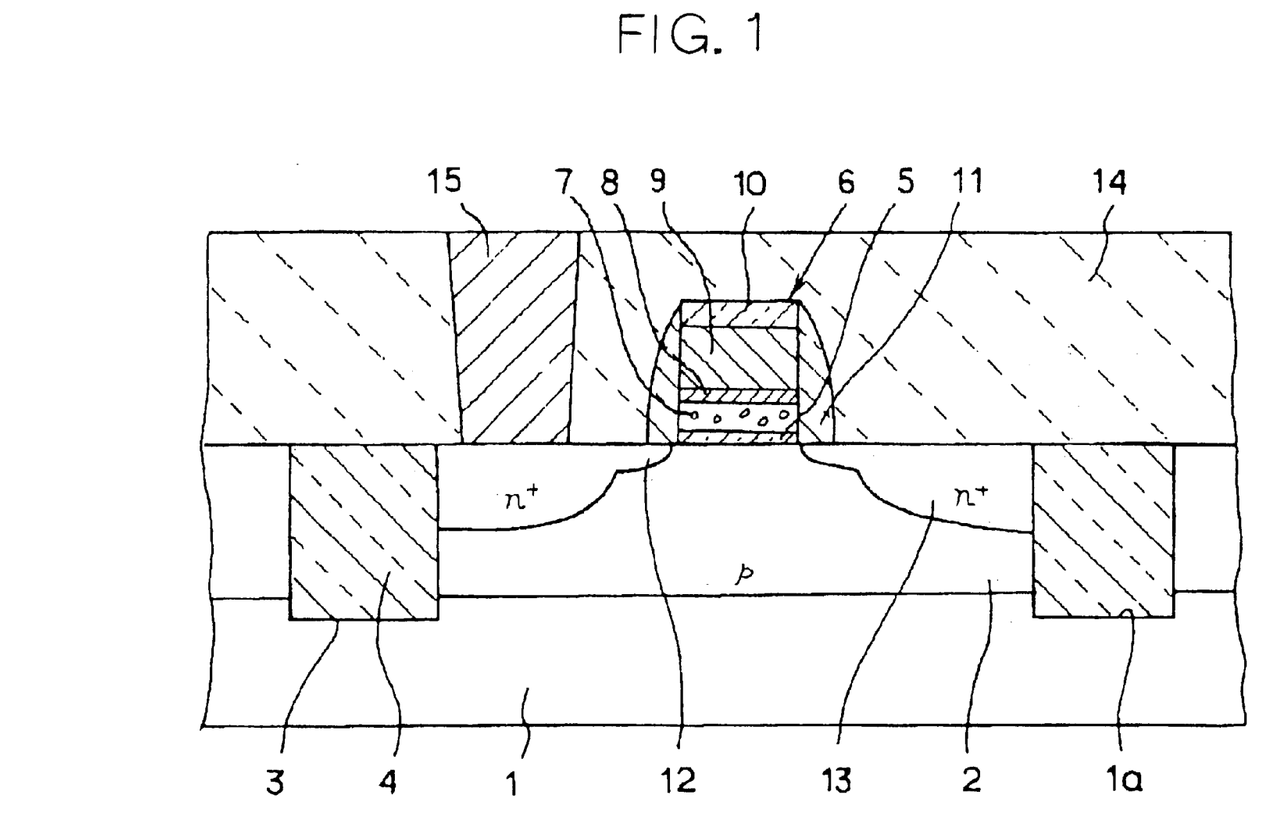
FIG. 1 is a section showing a MOS transistor embodying the present invention.

Referring to FIG. 1 of the drawings, a semiconductor device embodying the present invention is shown and applied to a gate electrode included in a MOS transistor by way of example. As shown, the semiconductor device includes a p-type or an n-type silicon substrate 1 formed with a p-well 2. A shallow device isolating groove structure (STI) 3 delimits an area in which a MOS transistor is to be formed. Specifically, to implement the STI 3, a shallow groove 1a is formed in the surface of the silicon substrate 1 and then filled with a silicon oxide film 4. In the above MOS transistor forming area, a gate insulation film 5 implemented by a silicon oxide film is formed on the surface of the silicon substrate 1. A polysilicon film 7, a barrier metal film 8 implemented by titanium nitride (TiN) and a tungsten nitride (WN) film 9 are sequentially laminated on the gate insulation film 5, constituting a gate electrode 6.

A silicon oxide film 10 is formed on the top of the gate electrode 6. Side walls 11 are formed on the sides of the gate electrode 6 and implemented by a silicon oxide film. The silicon oxide films 10 and 11 cover the gate electrode 6. Further, an LDD (Lightly Doped Drain) region 12 and a source and a drain region 13 are formed in the MOS transistor forming region of the silicon substrate 1 and doped with an n-type impurity lightly and heavily, respectively. In this manner, an n-channel MOS transistor is completed. An inter layer dielectric 14 is formed with a contact hole. A buried contact 15 is positioned in the contact hole and connected to the source and drain regions 13.

Figure 2A:
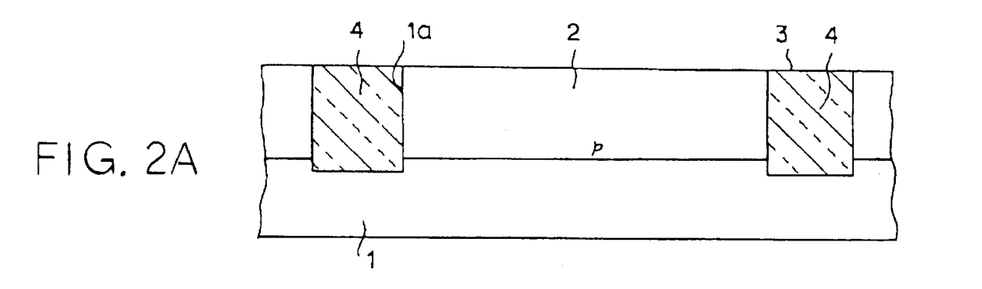
FIGS. 2A through 2F are sections demonstrating a sequence of steps for producing the MOS transistor of FIG. 1.

FIGS. 2A through 2F demonstrate a sequence of steps for producing the above-described MOS transistor. First, as shown in FIG. 2A, the p-well 2 is formed in the p-type or n-type silicon substrate 1 while the shallow groove 1a is formed in the device separating region of the substrate 1. Subsequently, the silicon oxide film 4 is buried in the shallow groove 1a to thereby form the STI 3. To bury the silicon oxide film 4 in the groove 1a, there may be used the following specific method. After the groove 1a has been formed in the silicon substrate 1, the silicon oxide film 4 is formed on the surface of the substrate 1 to a thickness greater than the depth of the groove 1a. The silicon oxide film 4 is then etched back by chemicomechanical polishing (CMP) so as to expose the surface of the silicon substrate 1. As a result, the silicon oxide film 4 is left in the groove 1a without being etched.

Figure 2B:
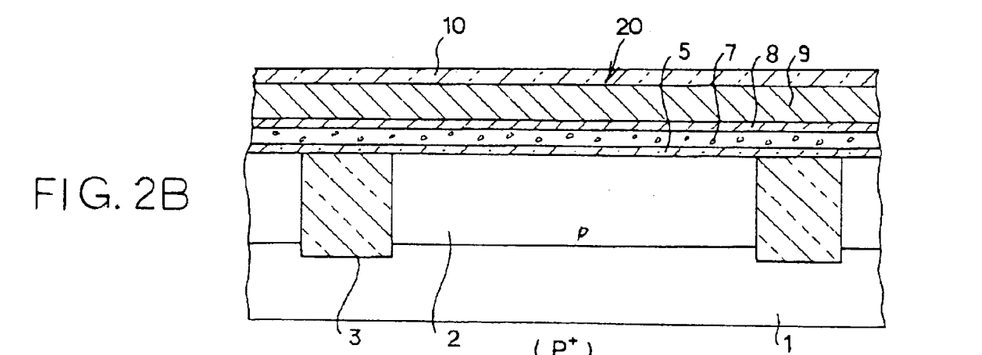

Subsequently, as shown in FIG. 2B, the surface of the silicon substrate 1 is cleaned. The silicon oxide film 5 is formed on the cleaned surface of the substrate 1 to a thickness of about 10 nm. The polysilicon film 7 containing phosphor (P) is formed on the silicon oxide film 5 to a thickness of about 10 nm by CVD (Chemical Vapor Deposition). The TiN film 8 is formed on the polysilicon film 7 to a thickness of about 10 nm by sputtering. The WN film 9 is formed on the TiN film 8 to a thickness of about 100 nm by CVD, which uses tungsten hexafluoride ($WF_6$) gas and ammonia ($NH_3$) gas. $WF_6$ gas belongs to a family of halogen-based metallic gases having high melting points. More specifically, for CVD of the WN film 9, a CVD reaction condition richer in nitrogen than a stoichiometric ratio is used, so that the WN film 9 is formed in an amorphous state. For example, $WF_6$ gas and $NH_3$ gas are introduced into a reaction chamber such that $WF_6$ is more than 1/500, but less than 10, with respect to $NH_3$. The WF6 gas and NH3 gas are caused to react at a growth temperature of room temperature to 550° C. and a reaction pressure of 0.01 Torr to 5.0 Torr. As a result, a conductive film 20 having a three-layer structure, i.e., a WN/TiN/polysilicon structure is formed. The silicon oxide film 5 implementing the gate insulation film may be replaced with a silicon nitride (SiN) film, a silicon oxide nitride (SiOxNy) film or a tantalum oxide (TaO) film, if desired.

Figure 2C:
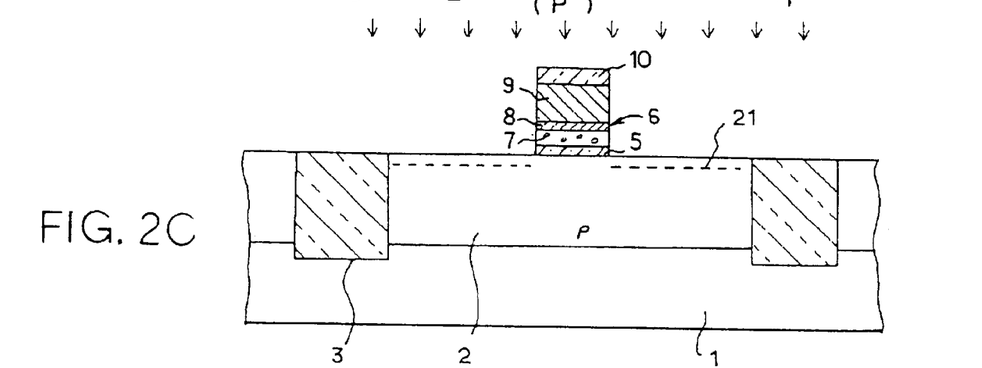

The silicon oxide film 10 having a suitable thickness is formed on the three-layer conductive film 20. After a photoresist film, not shown, has been formed on the silicon oxide film 10, the laminate shown in FIG. 2B is exposed to a gate electrode pattern and then developed to form a photoresist mask. Thereafter, the WN film 9, TiN film 8 and polysilicon film 7 constituting the conductive film 20 are sequentially etched via the photoresist mask. As a result, the gate electrode 6 is formed in a desired pattern, as shown in FIG. 2C. After the etching, the photoresist mask is removed. Subsequently, phosphor ($P^+$) ions are lightly implanted by a self-matching method using the gate electrode 6, so that a $P^+$ ion implanted layer 21 is formed in the major surface of the substrate 1 at both sides of the gate electrode 6.

Figure 2D:
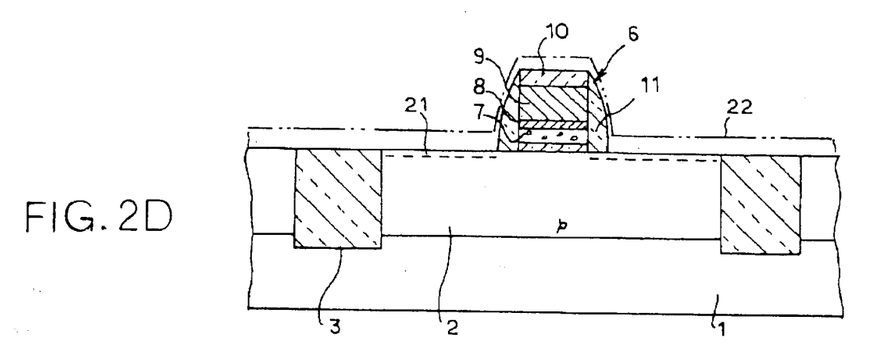
Figure 2E:
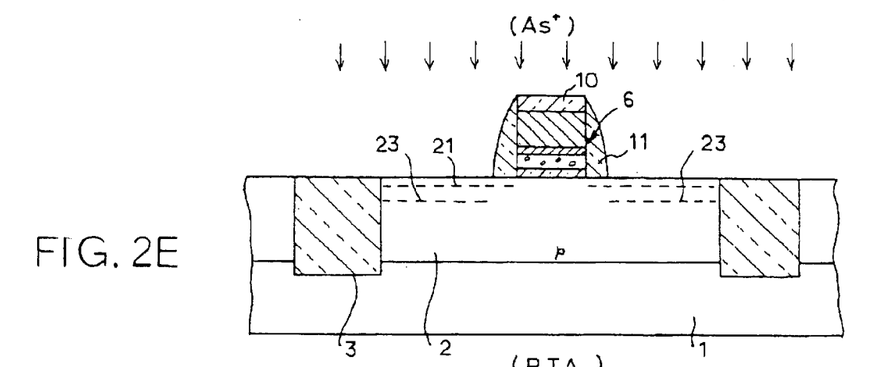

After the step shown in FIG. 2C, a silicon oxide film 22 having a desired thickness is formed on the entire surface of the laminate, as indicated by a dash-and-dots line in FIG. 2D. The silicon oxide film 22 is etched back by anisotropic etching such that the film 22 remains only on the sides of the gate electrode 6 and forms the side walls 11. Subsequently, as shown in FIG. 2E, arsenic ($As^+$) ions are heavily implanted in the laminate by the self-matching method using the gate electrode 6 and side walls 11. Consequently, an $As^+$ ion implanted layer 23 is formed in the major surface of the silicon substrate 1 at both sides of the side walls 11.

Figure 2F:
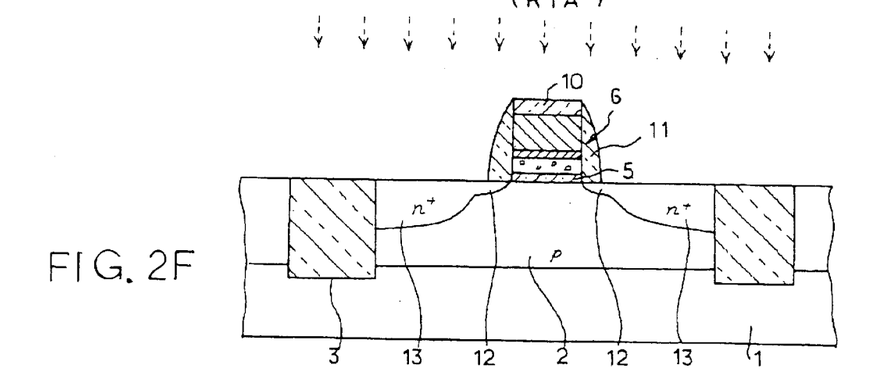

As shown in FIG. 2F, the silicon substrate 1 with the $As^+$ ion implanted layer 23 is annealed by a lamp annealer implemented by RTA (Rapid Thermal Annealing). In the illustrative embodiment, RTA is effected at 850° C. for 60 seconds. Lamp annealing causes the WN film 9 to release nitrogen (N) with the result that the WN film 9 changes into a substantially nitrogen-free WN film, i.e., a W film. It is to be noted that such a W film is also referred to as a WN film herein because nitrogen is not completely removed from the WN film 9. At the same time as the WN film 9 so changes, the crystallization of tungsten in the WN film 9 is improved and increases the crystal size of tungsten. At this instant, the TiN film or barrier metal film 8 between the WN film 9 and the polysilicon film 7 prevents polysilicon from reacting with tungsten, which is present in the WN film 9, and forming a tungsten suicide layer. In this manner, a metal/polysilicon structure is formed. It is noteworthy that the resistivity of the WN film or upper layer 9 decreases because of improved crystallization, lowering the resistivity of the entire gate electrode 6. Further, lamp annealing activates the $P^+$ ion implanted layer 21 and $As^+$ ion implanted layer 23 and thereby forms the low density, n-type LDD region 12 and high density, n-type source and drain regions 13.

After the above sequence of steps, the interlayer dielectric 14 is formed on the silicon substrate 1 in such a manner as to cover the n-channel MOS transistor. The buried contact 15 is formed in the contact hole formed in the interlayer dielectric 14 and connected to the source and drain regions 13, completing the MOS transistor structure shown in FIG. 1.

As stated above, the gate electrode 6 of the MOS transistor has a WN/TiN/polysilicon structure and causes the intermediate TiN film 8 to prevent tungsten of the WN film 9 and silicon of the polysilicon layer 7 from reacting with each other and forming a tungsten silicide layer. This is successful to implement a metal/polysilicon structure including the WN film 9 and polysilicon film 7. Further, the WN film 9 is formed in an amorphous state and then subjected to lamp annealing in order to remove nitrogen and to promote the crystallization of tungsten at the same time. It follows that tungsten crystallizes toward regions where nitrogen has disappeared, and therefore rapidly increases the grain size thereof. Consequently, the resistivity of the WN film 9 and therefore that of the entire metal/polysilicon structure is reduced. For this reason, even when the WN film 9 is as thin as 0.2 $\mu$m or less and the gate electrode 6 has a gate length as small as about 0.13 $\mu$m, low resistivity required of a semiconductor device is achievable.

Figure 3:
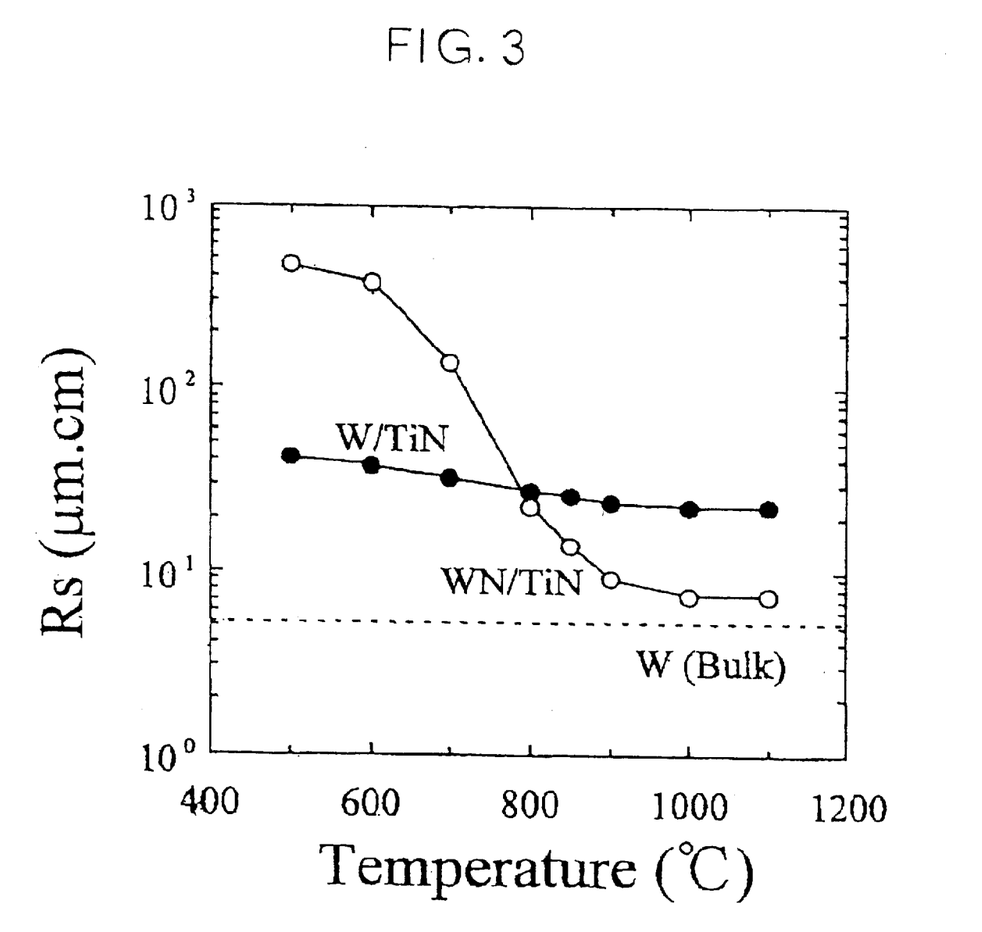
FIG. 3 is a graph showing a relation between resistivity Rs and annealing temperature.

To determine a relation between the lamp annealing temperature and the resistivity of the WN film 9, the resistivity of the portion where the WN film 9 and TiN film 8 are laminated was measured by varying the lamp annealing temperature. FIG. 3 is a graph showing the result of measurement and in which the ordinate and abscissa indicate resistivity Rs and lamp annealing temperature, respectively. Also, W (Bulk) is representative of the resistivity of bulk tungsten. W/TiN is representative of a structure including tungsten formed on a TiN film while WN/TiN is representative of the structure of the present invention in which the amorphous WN film is formed on the TiN film. The resistivity Rs of the W (Bulk) is constant without regard to the annealing temperature and slightly lower than 101. Although the resistivity Rs of the W/TiN structure decreases little by little in accordance with the rise of the annealing temperature, its slope is small; the resistivity Rs does not decrease below 101 even at 1,100° C.

By contrast, the resistivity Rs of the WN/TiN structure of the illustrative embodiment sharply decreases in accordance with the rise of the annealing temperature although it is higher than the resistivity Rs of the W/TiN structure by about one figure just after the formation. Specifically, the resistivity Rs of the WN/TiN structure was almost the same as the resistivity Rs of the W/TiN structure when the annealing temperature was 800° C. However, the WN/TiN structure was lower in resistivity Rs than the W/TiN structure when the annealing temperature exceeded 800° C., and was even lower than $10^1$ at 900° C. It is to be noted that the resistivity Rs of $10^1$ is substantially 4 $\Omega$.cm² to 6 $\Omega$.cm² in terms of sheet resistance. Therefore, the conductive film of the illustrative embodiment has resistivity as low as about one-third to one-fourth of the resistivity of the conventional W/TiN/polysilicon conductive film. Consequently, by effecting lamp annealing at 800° C. or above, preferably 900° C. or above, it is possible to realize an WN/TiN conductive film having sheet resistance of 4 $\Omega$.cm² or less.

Figure 4:
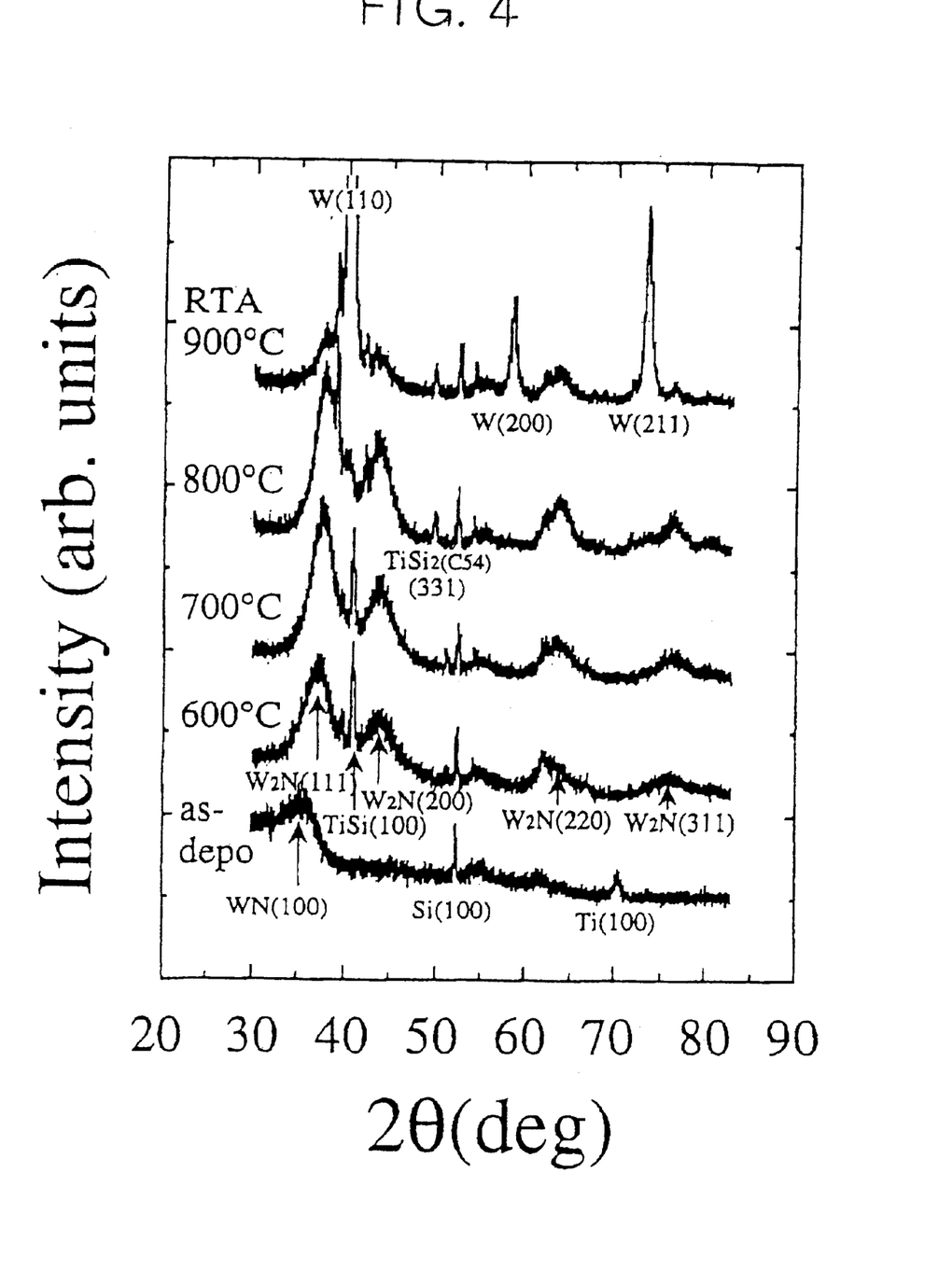
FIG. 4 is a view representative of a relation between annealing temperature and the components of WN.

FIG. 4 shows components contained in the WN film and detected by X-ray analysis at various lamp annealing temperatures. As shown, while the WN film 9 is in an amorphous state just after the deposition, a number of diffraction peaks of $W_2N$ appear as the annealing temperature rises, proving the polycrystallization of the WN film 9. At temperatures above 900° C., tungsten occupies substantially the entire WN film 9. In FIG. 4, parenthesized numerical values indicate crystal face orientations.

CVD used to form the WN film 9 in the illustrative embodiment may be replaced with sputtering, if desired. For example, a tungsten target, which is a high purity material, may be used to form a WN film in an argon atmosphere containing nitrogen gas by sputtering. In this case, a growth temperature of room temperature to 400° C. and a reaction pressure of $10^{-4}$ Torr to $10^{-2}$ Torr are selected. The WN film 9 to be formed by sputtering can be implemented by the same sputtering system as used to form the TiN film 8, which underlies the WN film 9, just after the TiN film 8. Sputtering is therefore desirable from the production efficiency standpoint.

In the illustrative embodiment, the conductive film is applied to the gate electrode of a MOS semiconductor. Particularly, the WT/TiN/polysilicon structure is subjected to lamp annealing at the same time as the ion implanted layers of the LDD region and source and drain regions are activated by heat. Alternatively, the lamp annealing of the above three-layer conductive film may, of course, be effected in an independent step.

Figure 5A:
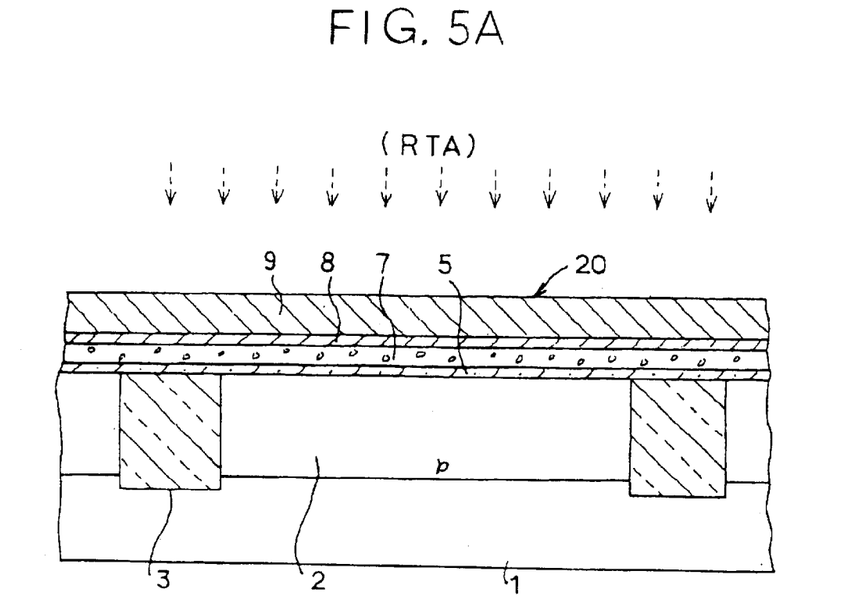
FIGS. 5A and 5B are sections each showing a particular alternative lamp annealing step.
Figure 5B:
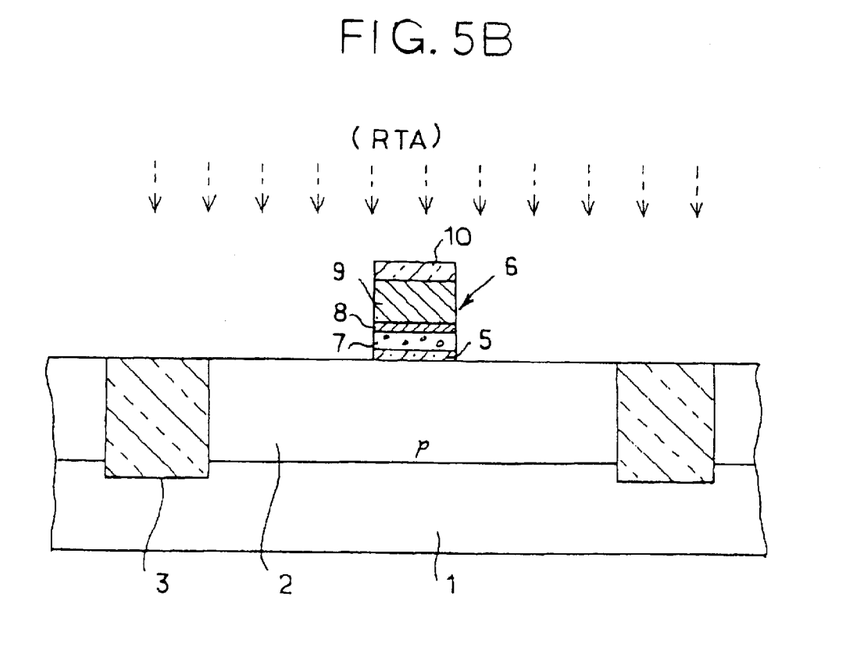

Particularly, in the illustrative embodiment, lamp annealing is effected after the silicon oxide films 10 and 11 have been formed in such a manner as to cover the gate electrode or three-layer conductive film 6. The silicon oxide films 10 and 11 may therefore happen to obstruct the parting of nitrogen from the WN film 9. In light of this, lamp annealing may be effected in the condition wherein the surface of the WN film 9 is exposed to the outside. For example, lamp annealing may be effected just after the three-layer conductive film 20 has been formed, as shown in FIG. 5, or just after the conductive film 20 and silicon oxide layer 10 have been patterned to form the gate electrode 6, as shown in FIG. 5B. Such an alternative scheme is successful to promote the parting of nitrogen from the WN film 9 and to further reduce the lamp annealing time. The crux is therefore that lamp annealing should preferably be effected at least before the films expected to cover the conductive film 20 are formed.

Figure 6:
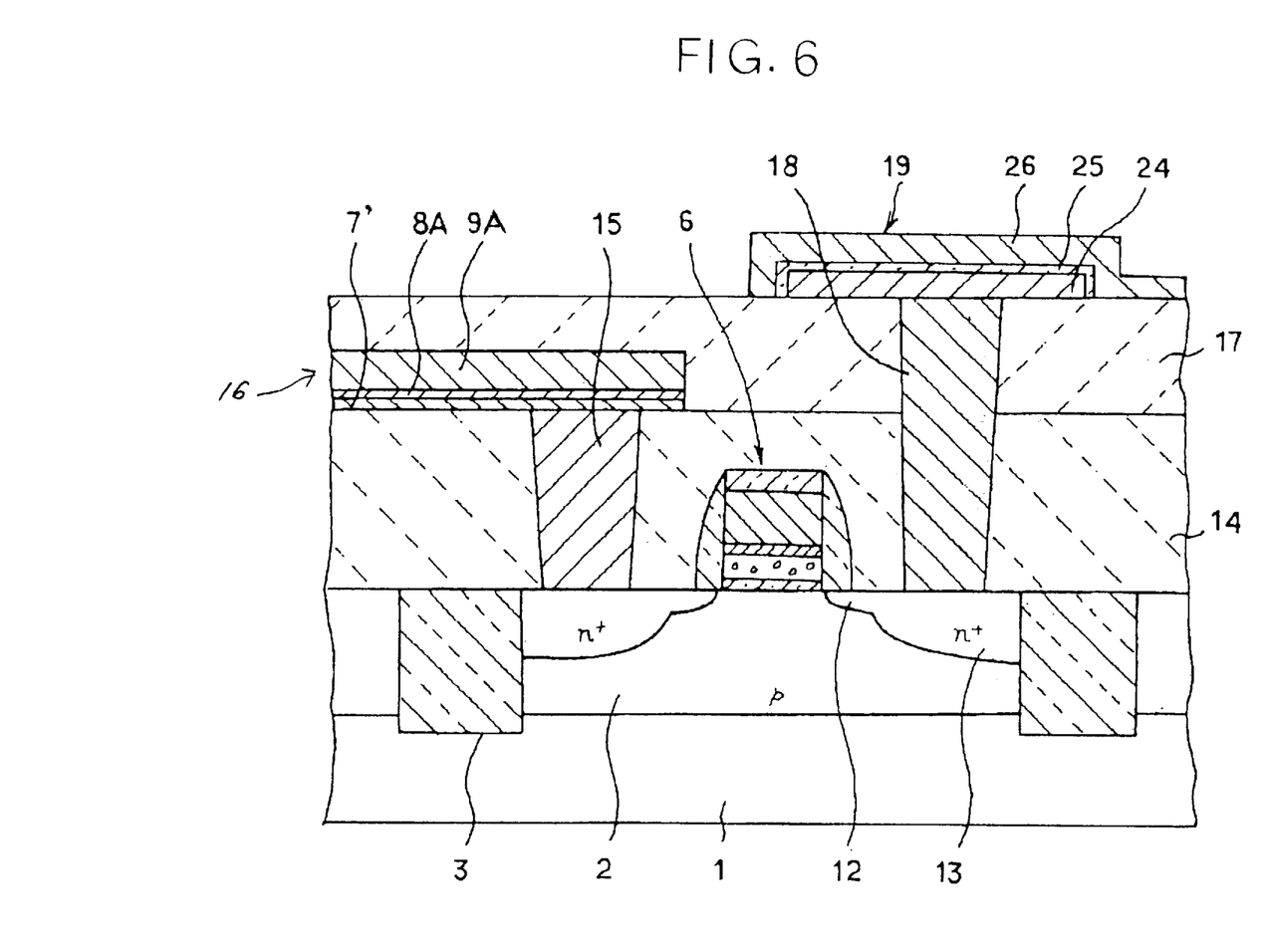
FIG. 6 is a section showing a specific DRAM (Dynamic Random Access Memory) cell configuration to which the illustrative embodiment is applied.

Further, the conductive film of the illustrative embodiment is, of course, applicable even to interconnections between devices. FIG. 6 shows a specific DRAM cell configuration using the MOS transistor of FIG. 1. As shown, after the MOS transistor has been formed by the previously described procedure, a bit line 16 is formed on the interlayer dielectric 14 and connected to the source region 13 by the buried contact 15 stated earlier. The bit line 16 is implemented as a three-layer conductive film made up of a Ti film 7', a TiN film 8A and a WN film 9A that are sequentially laminated in the same manner as in the illustrative embodiment. The conductive film is patterned and then subjected to lamp annealing in order to lower the resistance of the WN film 9A and therefore the sheet resistance of the bit line 16.

Subsequently, a second interlayer dielectric 17 is formed on the interlayer dielectric 14. A buried contact 18 is formed in the second interlayer dielectric 17 and connected to the drain region 13. Thereafter, a charge store electrode 24, a capacity insulation film and a counter electrode 26 are sequentially formed on the second interlayer dielectric 17, constituting a capacitor 19. In this configuration, the buried contact 18 connects the charge store electrode 24 to the drain region 13.

The DRAM shown in FIG. 6 has the gate electrode 6, which serves as a word line, and the bit line 16 each having WT/TiN on the top. This, coupled with the fact that the WN films 9 and 9A have their resistance lowered by lamp annealing, realizes a high-speed DRAM cell or DRAM circuit.

In summary, in accordance with the present invention, a polysilicon film, a barrier metal film and a high melting point, metal nitride film are sequentially laminated to constitute a conductive film. Subsequently, the conductive film is annealed to lower the resistance of the metal nitride film. Annealing causes the metal nitride film, which is formed in an amorphous state, to release nitrogen and increases the crystal size of metal having a high melting point. This successfully improves the crystallization of the high melting point metal and lowers the resistance of the metal nitride film without regard to the crystallization of the underlying barrier metal film. It is therefore possible to improve the crystallization of the metal nitride film or to obviate the step of providing the barrier metal film with a double-layer structure, i.e., to simplify the production procedure. Even when the thickness of the metal nitride film and the width of the conductive film are reduced to promote the integration of the semiconductor device, the above simple production procedure is capable of providing the conductive layer with resistance lower than required resistance. The present invention therefore realizes a high speed, highly integrated semiconductor device.

Various modifications will become possible for those skilled in the art after receiving the teachings of the present disclosure without departing from the scope thereof. For example, the metal having a high melting point, which constitutes the metal nitride film, and/or the metal constituting the barrier metal film underlying it may be replaced with any other suitable metal comparable in function.

What is claimed is:

1. A method of producing a conductive film included in a semiconductor device, comprising:
   (a) sequentially forming a laminate made up of a polysilicon film, a barrier metal film and a metal nitride film having a high melting point on an insulation film in this order; and
   (b) annealing said laminate to thereby lower a resistance of said metal nitride film and activate an ion implanted layer at the same time;
      wherein said barrier metal film is comprised of titanium nitride and said barrier metal film forming is free of a separate annealing step and
      wherein said barrier metal film consist essentially of a single layer structure.

2. A method as claimed in claim 1, wherein said metal nitride film is formed in an amorphous state under a condition containing at least 0.1 of nitrogen.

3. A method as claimed in claim 2, wherein said metal nitride film is formed by CVD or sputtering.

4. A method of producing a gate electrode included in a MOS transistor, comprising
   (a) sequentially forming a polysilicon film, a barrier metal film and a metal nitride layer having a high melting point on a gate insulation film in this order to thereby constitute a conductive film having a laminate structure;
   (b) patterning said conductive film to thereby form the gate electrode;
   (c) implanting ions in a source and a drain region in a semiconductor layer by using the gate electrode as a mask; and
   (d) effecting annealing to thereby activate resulting ion implanted layers and lower a resistance of said metal nitride film at the same time;
      wherein said barrier metal film is comprised of titanium nitride and said barrier metal film forming is free of a separate annealing step; and
      wherein said barrier metal film consist essentially of a single layer structure.

5. A method as claimed in claim 4, wherein said metal nitride film is formed in an amorphous state under a condition containing at least 0.1 of nitrogen.

6. A method as claimed in claim 5, wherein said metal nitride film is formed by CVD or sputtering.

7. A method as claimed in claim 6, wherein said metal nitride film is annealed in order to release nitrogen contained in said metal nitride film.

8. A method as claimed in claim 7, wherein said metal nitride film is subjected to rapid thermal processing using lamp annealing.

9. A method as claimed in claim 8, wherein said metal nitride film is annealed at a temperature of 800° C. or above, preferably at 900° C. or above.

10. A method as claimed in claim 5, wherein said metal nitride film is annealed in order to release nitrogen contained in said metal nitride film.

11. A method as claimed in claim 10, wherein said metal nitride film is subjected to rapid thermal processing using lamp annealing.

12. A method as claimed in claim 11, wherein said metal nitride film is annealed at a temperature of 800° C. or above, preferably at 900° C. or above.

13. A method as claimed in claim 4, wherein said metal nitride film is annealed in order to release nitrogen contained in said metal nitride film.

14. A method as claimed in claim 13, wherein said metal nitride film is subjected to rapid thermal processing using lamp annealing.

15. A method as claimed in claim 14, wherein said metal nitride film is annealed at a temperature of 800° C. or above, preferably at 900° C. or above.

16. A method of producing a gate electrode included in a MOS transistor, comprising:
   (a) sequentially forming a polysilicon film, a barrier metal film and a metal nitride film having a high melting point on a gate insulation film in this order to thereby constitute a conductive film having a laminate structure;
   (b) annealing said conductive film to thereby lower a resistance of said metal nitride layer and activate an ion implanted layer at the same time; and
   (c) patterning said conductive film to thereby form the gate electrode;

wherein said barrier metal film is comprised of titanium nitride and said barrier metal film forming is free of a separate annealing step, and wherein said barrier metal film consist essentially of a single layer structure.

17. A method as claimed in claim 16, wherein said metal nitride film is formed in an amorphous state under a condition containing at least 0.1 of nitrogen.

18. A method as claimed in claim 17, wherein said metal nitride film is formed by CVD or sputtering.

19. A method as claimed in claim 18, wherein said metal nitride film is annealed in order to release nitrogen contained in said metal nitride film.

20. A method as claimed in claim 19, wherein said metal nitride film is subjected to rapid thermal processing using lamp annealing.

21. A method as claimed in claim 20, wherein said metal nitride film is annealed at a temperature of 800° C. or above, preferably at 900° C. or above.

22. A method as claimed in claim 17, wherein said metal nitride film is annealed in order to release nitrogen contained in said metal nitride film.

23. A method as claimed in claim 22, wherein said metal nitride film is subjected to rapid thermal processing using lamp annealing.

24. A method as claimed in claim 23, wherein said metal nitride film is annealed at a temperature of 800° C. or above, preferably at 900° C. or above.

25. A method as claimed in claim 16, wherein said metal nitride film is annealed in order to release nitrogen contained in said metal nitride film.

26. A method as claimed in claim 25, wherein said metal nitride film is subjected to rapid thermal processing using lamp annealing.

27. A method as claimed in claim 26, wherein said metal nitride film is annealed at a temperature of 800° C. or above, preferably at 900° C. or above.

* * * * *